US008321779B2

(12) United States Patent
Shin et al.

(10) Patent No.: US 8,321,779 B2
(45) Date of Patent: **\*Nov. 27, 2012**

(54) SEMICONDUCTOR DEVICE AND METHOD FOR OPERATING THE SAME (75) Inventors: Beom-Ju Shin, Kyoungki-do (KR); Sang-Sic Yoon, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 1019 days.

This patent is subject to a terminal disclaimer.

(21) Appl. No.: 12/215,726

(22) Filed: Jun. 30, 2008

(65) Prior Publication Data

US 2009/0222713 A1 Sep. 3, 2009

(30) Foreign Application Priority Data

Feb. 29, 2008 (KR) ........................ 10-2008-0019067

(51) Int. Cl.
*G06F 11/10* (2006.01)
*G06F 11/30* (2006.01)

(52) U.S. Cl. ........................................ 714/807; 714/746

(58) Field of Classification Search .................. None
See application file for complete search history.

(56) References Cited

U.S. PATENT DOCUMENTS

| 6,340,899 | B1 * | 1/2002 | Green .......................... 326/115 |
| 2003/0175037 | A1 * | 9/2003 | Kimmitt et al. ............... 398/198 |
| 2007/0014342 | A1 * | 1/2007 | Sindalovsky et al. ......... 375/224 |
| 2009/0006881 | A1 * | 1/2009 | Ogura .......................... 713/500 |
| 2009/0132888 | A1 * | 5/2009 | Bains et al. .................... 714/758 |
| 2009/0219764 | A1 * | 9/2009 | Shin et al. ................ 365/189.02 |
| 2009/0222707 | A1 * | 9/2009 | Shin et al. ..................... 714/758 |

FOREIGN PATENT DOCUMENTS

| JP | 63109543 A | * | 5/1988 |
| JP | 02-143991 A | | 6/1990 |
| KR | 10-2001-0071455 A | | 7/2001 |
| KR | 10-2008-0024413 A | | 3/2008 |

* cited by examiner

*Primary Examiner* — John Trimmings
*Assistant Examiner* — Dipakkumar Ghandi
(74) *Attorney, Agent, or Firm* — Blakely, Sokoloff, Taylor & Zafman (57) ABSTRACT

Semiconductor device includes a pad for outputting a cyclic redundancy check (CRC) data for error detection and a signal outputting unit for outputting the CRC data or a data strobe signal, which is output together with data of being output in response to a read command, through the pad according to operation modes. Method for operating a semiconductor device provided a step of outputting a CRC data for error detection through a CRC data pad and a step of outputting a data strobe signal, which is output together with data output in response to a read command, through the CRC data pad according to an operation mode.

17 Claims, 8 Drawing Sheets

SEMICONDUCTOR DEVICE AND METHOD FOR OPERATING THE SAME

CROSS-REFERENCE TO RELATED APPLICATIONS

The present invention claims priority of Korean patent application number 10-2008-0019067, filed on Feb. 29, 2008, which is incorporated by reference in its entirety.

BACKGROUND OF THE INVENTION

The present invention relates to a high-speed semiconductor device, and more particularly, to an apparatus and method for controlling an error detection code (EDC) in a high-speed semiconductor device.

In a system with a variety of semiconductor devices, a semiconductor device serves as a data storage. The semiconductor device outputs data corresponding to addresses received from a data processor, e.g., a central processing unit (CPU), or stores data received from the data processor into memory cells selected by addresses.

As the operating speed of the system increases and semiconductor integrated circuit technologies are advanced, semiconductor devices are required to input and output data at higher speed. In order for faster and more stable operation of semiconductor devices, a variety of circuits inside the semiconductor devices must be able to operate at a high speed and transfer signals or data between the circuits at a high speed.

Fast operation of the semiconductor device can be achieved by executing a plurality of internal operations at higher speed and increasing signal and data input/output speeds. As one example, a double data rate (DDR) synchronous dynamic random access memory (DRAM) can achieve a high-speed data transfer by outputting data in synchronization with falling and rising edges of a system clock. Since the DDR SDRAM can input and output two data through one input/output terminal in one cycle of the system clock, its data input/output speed is higher than that of a typical semiconductor device. At present, a semiconductor device has been proposed which inputs and outputs four data in one cycle of a system clock.

The DDR SDRAM adopts a prefetch operation in order to output data at a high speed. The prefetch operation previously stores data or commands at a high speed, before the data or commands are processed. For example, the DDR SDRAM accesses memory cells and outputs 2-bit data through a data pad in each clock cycle. Such a prefetch operation is referred to as a 2-bit prefetch operation. In addition, a DDR2 SDRAM adopts a 4-bit prefetch operation to access memory cells and output 4-bit data to a data pad in each clock cycle. A DDR3 SDRAM adopts an 8-bit prefetch operation to access memory cells and output 8-bit data to a data pad in each clock cycle. In this way, the data input/output speed must have been increased in order to enable the semiconductor device to operate at a high speed in synchronization with a high-frequency clock. Hence, the semiconductor device adopts an operation scheme that reads or writes data corresponding to a minimum burst length to each data input/output pad (DQ) in response to one-time read or write command. This scheme is referred to as an N-bit prefetch operation, where N is equal to the minimum burst length.

As described above, since a semiconductor device recently proposed is required to input and output four data in one cycle of a system clock, it adopts an 8-bit prefetch operation for high-speed data input/output. Eight data output from unit cells in response to one read command are transferred in parallel through the corresponding sense amplifiers and data input/output lines. The parallel data are serialized in order to output them through one data pad. In order to control such an operation, the semiconductor device includes a plurality of data output circuits respectively connected to a plurality of data input/output pads.

When there is no physical damage inside a system, a data transfer error is generated by the mismatching of operation timing between a data transmitting side and a data receiving side. In general, since an operation margin is sufficient when a semiconductor device and a data processor transfer data in synchronization with a low-frequency system clock, data reliability is fine. However, if a semiconductor device and a data processor operate in synchronization with a clock system having a high frequency of, for example, 4 Gbps, data reliability may be greatly degraded because the operation margin for data transfer is not sufficient. Also, a separate apparatus and method are additionally required for ensuring the reliability as to whether the data transfer is exactly achieved while the operating speed of the semiconductor device is increasing and four data are input/output in one cycle of the system clock. As one approach, a semiconductor device recently proposed includes a separate pad for outputting an error detection code (EDC). The output of the EDC aims at detecting the error of data transferred in the read or write operation.

In order to ensure the reliability of data transfer, the semiconductor device outputs a cyclic redundancy check (CRC) data through an EDC pad. When the semiconductor device outputs the CRC data, the data processor receives the CRC data and detects the data error. However, there are no feasible approaches to both outputting the CRC data and correcting the error of the data transferred in the read and write operations.

SUMMARY OF THE INVENTION

Embodiments of the present invention are directed to providing a high-speed semiconductor device capable of increasing the reliability of data transfer. In particular, the semiconductor device can prevent data from being distorted in a read and/or write operation, by outputting a data strobe signal for data output in response to a read command, as well as a CRC data, through an EDC pad according to an operation mode.

In accordance with an aspect of the present invention, there is provided a pad for outputting a cyclic redundancy check (CRC) data for error detection and a signal outputting unit for outputting the CRC data or a data strobe signal, which is output together with data of being output in response to a read command, through the pad according to operation modes. In accordance with another aspect of the present invention, there is provided a plurality of pads through which input/output data and signals are transferred, a first unit configured to output a CRC data for an error detection operation through a single pad of the plurality of pads and a second unit configured to output a data strobe signal, which is output together with data output in response to a read command, through the single pad. In accordance with another aspect of the present invention, there is provided a first serializer configured to receive eight parallel CRC data to output four successive data having four times the data window of a serialized eight data, or output a first pattern for a strobe signal according to an operation mode or a second pattern to be output in a standby state, a second serializer configured to receive an output of the first serializer to output two pieces of four successive data having two times the data window of the serialized eight data and a third serializer configured to receive an output of the second serializer to output the serialized data.

DESCRIPTION OF SPECIFIC EMBODIMENTS

Hereinafter, a semiconductor device and a method for operating the same in accordance with the present invention will be described in detail with reference to the accompanying drawings.

Figure 1:
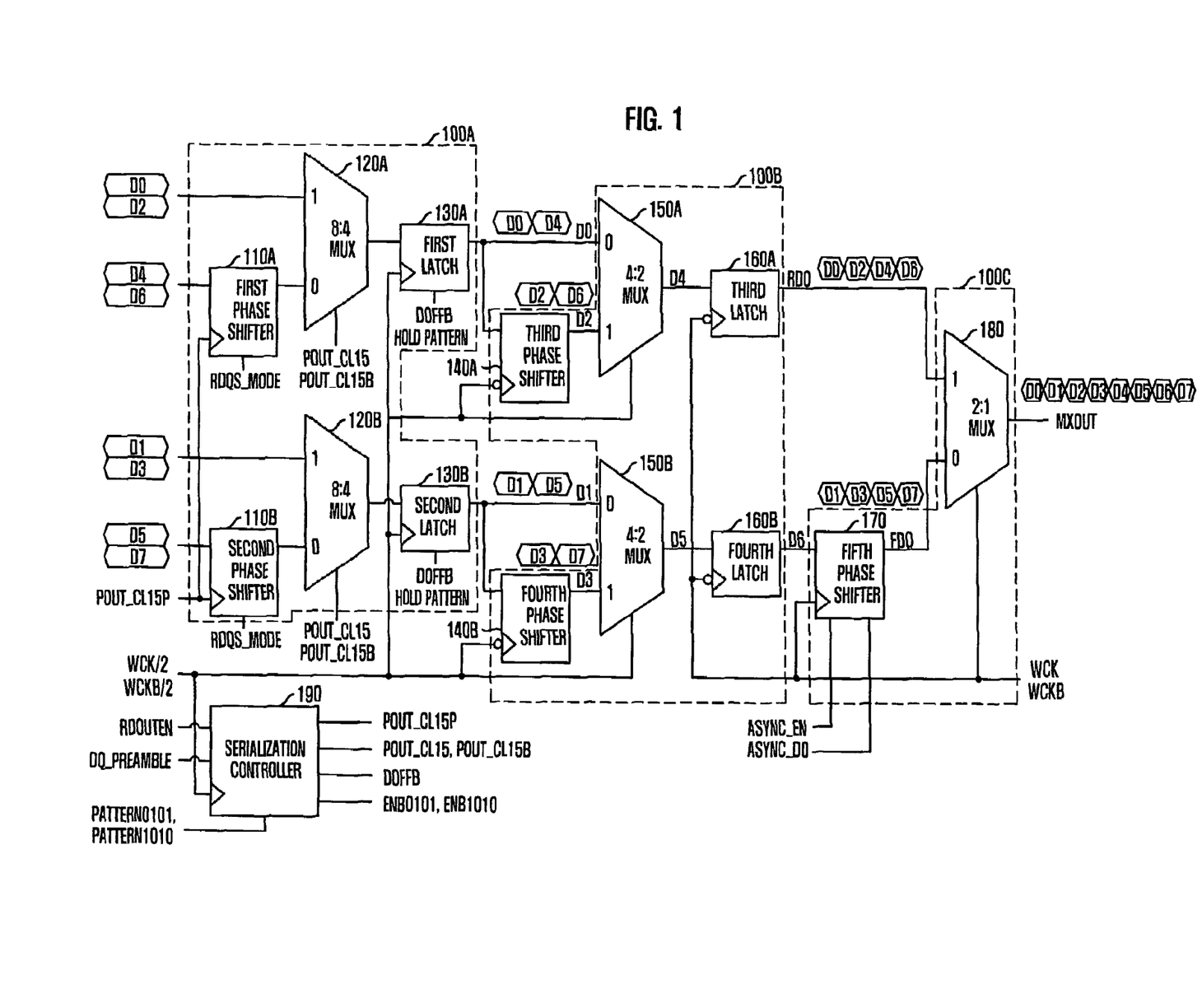
FIG. 1 is a block diagram of a semiconductor device in accordance with an embodiment of the present invention.

FIG. 1 is a block diagram of a semiconductor device in accordance with an embodiment of the present invention.

Referring to FIG. 1, the semiconductor device includes a pad for outputting a CRC data for error detection. A CRC data or a data strobe signal DQS is output through the pad according to an operation mode. At this point, the data strobe signal DQS is a signal that is output together with data output in response to a read command. Generally, the semiconductor device includes a plurality of pads for transferring input/output data and signals. A semiconductor device recently proposed is required to include an EDC pad in order to increase the reliability of data transfer in a high-speed operation. The EDC includes the CRC data for detecting an error in the read and write operations. The CRC data is transferred to a data output circuit connected to the pad through a global input/output line (GLOBAL DATA LINES).

The semiconductor device in accordance with an embodiment of the present invention outputs the CRC data through the EDC pad in an error detection mode, and outputs the data strobe signal DQS through the EDC pad in a strobe mode. The data strobe signal DQS is a clock-like toggling signal that is output to the outside according to a column address strobe (CAS) latency (CL) together with data output in response to the read command.

Therefore, the semiconductor device includes a data path for outputting the CRC data of the read and write operations through the EDC pad in an error detection mode, and a data path for outputting a preset EDC hold pattern in a standby mode. Generally, in the read operation, data corresponding to a burst length (BL) are successively output through data input/output pads according to a CAS latency (CL). In addition, although the standby mode before and after outputting the data is determined by a termination circuit, a new high speed memory device of this embodiment outputs a logic high level in the standby mode because the termination circuit is set to a power supply voltage level. On the other hand, the EDC pad outputs the CRC data according to a write CRC latency (CRCWL) in the write operation, and outputs the CRC data corresponding to the burst length (BL) according to a read CRC latency (CRCRL) in the read operation. Furthermore, a 4-bit EDC hold pattern preset in a mode register is output in the standby mode before and after outputting the CRC data.

The write CRC latency (CRCWL) defines a time taken until the CRC data is output after the write latency (WL) elapses since the input of the write command. The read CRC latency (CRCRL) defines a time taken until the CRC data is output after the CAS latency (CL) elapses since the input of the read command. For example, when the CAS latency (CL) is 17 and the read CRC latency (CRCRL) is 3, the CRC data is output at the moment a time of 20×tCK (17+3=20) elapses from the input of the read command.

Furthermore, the semiconductor device in accordance with an embodiment of the present invention outputs the data strobe signal DQS through the EDC pad in the strobe mode. When a strobe mode signal RDQS_MODE is activated, the data output circuit outputs a data pattern "1010" according to the CAS latency (CL) after the input of the read command, instead of outputting the CRC data. At this point, a preamble of a pattern "1010" is added to the data pattern "1010". In this way, it can be recognized that the data strobe signal DQS, which is a toggling signal like "101010", is output through the EDC pad. Furthermore, prior to the output of the data strobe signal DQS, the logic high level is output from the termination circuit in the strobe mode, regardless of the pattern preset in the mode register.

Referring to FIG. 1, the semiconductor device according to the embodiment of the present invention includes a first serializer 100A, a second serializer 100B, and a third serializer 100C. The first serializer 100A serializes eight parallel CRC data into four successive data. The second serializer 100B receives an output of the first serializer 100A to output two successive data. The third serializer 100C receives an output of the second serializer 100B to output eight serialized data. The first serializer 100A outputs different signals according to an operation mode of the semiconductor device. The first serializer 100A serializes eight parallel CRC data into four successive data in an error detection mode, and outputs a pattern preset in a mode register to the second serializer 100B in a standby mode before and after outputting eight CRC data. In a strobe mode, the first serializer 100A outputs a pattern for generating the toggling data strobe signal DQS, and outputs a logic high level signal in the standby mode before and after outputting the data strobe signal DQS.

More specifically, the first serializer 100A includes first and second phase shifters 110A and 110B, first and second multiplexers 120A and 120, and first and second latches 130A and 130B. In the error detection mode, not the strobe mode, the first and second phase shifters 110A and 110B shift phases of four data D4 to D7 of eight CRC data D0 to D7 by four times (4UI) the data window (UI) of the eight data output through the pad. The first and second multiplexers 120A and 120B output two pieces of four successive data by multiplexing the four data D0 to D3 of the eight data and outputs of the first and second phase shifters 110A and 110B. The first and second latches 130A and 130B latch outputs of the first and second multiplexers 120A and 120B. When the strobe mode signal RDQS_MODE is activated, the first phase shifter 110A outputs a pattern of a logic high level and the second phase shifter 110B outputs a pattern of a logic low level.

The following description will be made about a process of serializing eight parallel CRC data D0 to D7 through the first to third serializers 100A to 100C in the error detection mode and outputting the serialized data through the EDC pad. Odd-numbered data D0, D2, D4 and D6 of the eight parallel data D0 to D7 are serialized in pairs, two by two, by the first multiplexer 120A. To this end, the first phase shifter 110A shifts the phases of the two data D4 and D6 of the odd-numbered data by the window (4UI) of the data aligned by the first and second multiplexers 120A and 120B. Likewise, even-numbered data D1, D3, D5 and D7 are serialized through the second phase shifter 110B and the second multiplexer 120B. The four data paired two by two by the first and second multiplexers 120A and 120B are latched by the first and second latches 130A and 130B, respectively. Each data window of the four data including two successive data output from the first and second latches 130A and 130B of the first serializer 100A is four times the window of the serialized eight data output from the third serializer 100C.

In addition, the second serializer 100B includes third and fourth phase shifters 140A and 140B, third and fourth multiplexers 150A and 150B, and third and fourth latches 160A and 160B. The third and fourth phase shifters 140A and 140B shift phases of the two data D2-D6 and D3-D7 of the four data output from the first and second latches 130A and 130B by two times (2UI) the data window of the serialized eight data. The third and fourth multiplexers 150A and 150B output two pieces of four successive data D0-D2-D4-D6 and D1-D3-D5-D7 by multiplexing the two data D0-D4 and D1-D5 of the four data and outputs of the third and fourth phase shifters 140A and 140B. The third and fourth latches 160A and 160B latch outputs of the third and fourth multiplexers 150A and 150B.

More specifically, the third and fourth phase shifters 140A and 140B delay the two data D2-D6 and D3-D7 of the four data output from the first and second latches 130A and 130B of the first serializer 100A by using a clock WCK/2 and WCKB/2 produced by dividing data clocks WCK and WCKB by 2. The data clocks WCK and WCKB serve as a reference in outputting the serialized eight data. Two data are output in one cycle of the data clocks WCK and WCKB. That is, each data window (UI) of the serialized CRC data is equal to half the cycle of the data clocks WCK and WCKB. The third and fourth phase shifters 140A and 140B delays the phases of the two data D2-D6 and D3-D7 by two times the data window (UI) of the serialized eight data by using divided clocks WCK/2 and WCKB/2 whose cycles are four times the data window (UI) of the serialized eight data. The third and fourth multiplexers 150A and 150B outputs two pieces of four successive data D0-D2-D4-D6 and D1-D3-D5-D7 by aligning two data D2-D6 and D3-D7, whose phases are delayed by the third and fourth phase shifters 140A and 140B, and the remaining two data D0-D4 and D1-D5. The third and fourth latches 160A and 160B latch outputs of the third and fourth multiplexers 150A and 150B and transfer the latched data to the third serializer 100C.

The third serializer 100C includes a fifth phase shifter 170 and a fifth multiplexer 180. The fifth phase shifter 170 shifts a phase of the data D1-D3-D5-D7 by the data window (UI) of the serialized eight data. The fifth multiplexer 180 outputs the serialized CRC data D0-D1-D2-D3-D4-D5-D6-D7 by multiplexing the data D0-D2-D4-D6 and an output of the fifth phase shifter 170.

Referring to FIG. 1, the data output circuit further includes a serialization controller 190 that outputs a first control pulse POUT_CL15P for controlling the first and second phase shifters 110A and 110B, a second control pulse POUT_CL15 for controlling the first and second multiplexers 120A and 120B, and a data transfer signal DOFFB for controlling the first and second latches 130A and 130B in response to the read data output enable signal RDOUTEN for enabling the data output according to the read command, the strobe mode signal RDQS_MODE, and the divided clock WCK/2 produced by dividing the data clock WCK serving as the reference of the data output.

The following description will be made about the operation of the data output circuit when the data strobe signal DQS is output the outside through the EDC pad. When the strobe mode signal RDQS_MODE is activated, the first phase shifter 110A outputs logic high level signal and the second phase shifter 110B outputs a logic low level signal, regardless of the first control pulse POUT_CL15P. At this point, the serialization controller 190 maintains the second control pulse POUT_CL15 at a logic low level so that the first and second multiplexers 120A and 120B can transfer the fixed logic level signals output from the first and second phase shifters 110A and 110B. In addition, when the strobe mode signal RDQS_MODE is activated, the serialization controller 190 activates the data transfer signal DOFFB in response to the read data output enable signal RDOUTEN. Thus, the data transfer signal DOFFB enables the first and second latches 130A and 130B for 3 tCK from 1 tCK (one cycle of the system clock) earlier than the case of the error detection mode.

The signals output from the first and second latches 130A and 130B are phase-shifted and then serialized through the third and fourth phase shifters 140A and 140B and the third and fourth multiplexers 150A and 150B of the second serializer 100B. The signal output from the third multiplexer 150A receiving the logic high level signal and the signal output from the fourth multiplexer 150B receiving the logic low level signal are output to the outside through the third multiplexer 180, just like the serialized eight data D0-D1-D2-D3-D4-D5-D6-D7. At this point, the fifth multiplexer 180 alternately outputs the logic high level signal and the logic low level signal. Such a toggling signal can be used as the data strobe signal DQS.

Figure 2:
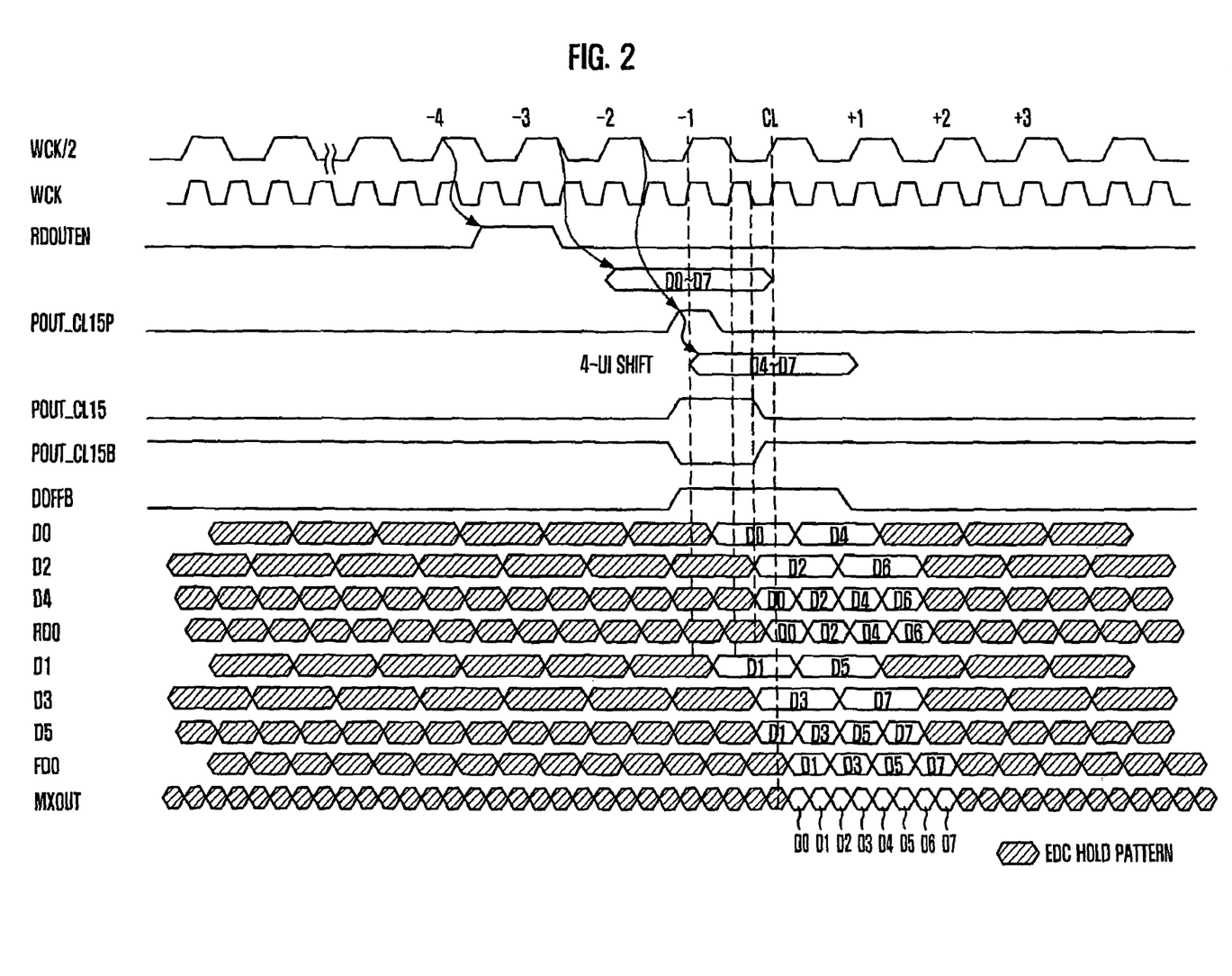
FIG. 2 is a timing diagram illustrating the operation of the semiconductor device of FIG. 1.

FIG. 2 is a timing diagram illustrating the operation of the semiconductor device of FIG. 1. In particular, the operation of the data output circuit of the semiconductor device in the error detection mode will be described focusing on the data clock WCK and the divided clock WCK/2. Also, a high speed memory device that uses the divided clock WCK/2 having a frequency equal to that of the system clock and outputs four data in one cycle tCK of the system clock is exemplarily illustrated in FIG. 2.

As illustrated in FIG. 2, after the read command is input, the semiconductor device outputs the serialized eight successive CRC data D0-D1-D2-D3-D4-D5-D6-D7 after a time point at which the CAS latency (CL) and the read CRC latency (CRCRL) elapse. At this point, the data output circuit outputs 4-bit EDC hold pattern preset in the mode register before and after outputting the eight CRC data D0-D1-D2-D3-D4-D5-D6-D7.

More specifically, the read data output enable signal RDOUTEN is activated according to the read command at a time point earlier that the read CRC latency (CRCRL) by 4 tCK (four cycles of the system clock). Then, the serialization controller 190 of the data output circuit generates a plurality of signals for controlling the first serializer 100A in response to the read data output enable signal RDOUTEN. In addition, the plurality of CRC data D0-D7 output from the unit cells are transferred to the data output circuit at a time point earlier than the CAS latency (CL) by 2.5 tCK.

The plurality of CRC data D0-D7 are transferred to the data output circuit in parallel. The data output circuit outputs eight successive data D0-D1-D2-D3-D4-D5-D6-D7 by serializing the plurality of CRC data D0-D7 input in parallel. First, the serialization controller 190 activates the first control pulse POUT_CL15P at a time point earlier than the CAS latency (CL) by 1.5 tCK in response to the read data output enable signal RDOUTEN. The first and second phase shifters 110A and 110B of the first serializer 100A delay the phases of the four data D4-D7 by 1 tCK (4UI) in response to the activated first control pulse POUT_CL15P.

In addition, the serialization controller 190 activates the second control pulse POUT_CL15 to a logic high level at a time point earlier than the CAS latency (CL) by 1.5 tCK, just like the first control pulse POUT_CL15P. At this point, the inverted signal POUT_CL15B of the second control pulse POUT_CL15 has a logic low level. The first and second multiplexers 120A and 120B serialize the four data D0-D3, which are input in parallel in response to the second control pulse POUT_CL15 and the inverted signal POUT_CL15B of the second control pulse POUT_CL15, and the remaining four data D4-D7, whose phases are shifted through the first and second phase shifters 110A and 110B. The first and second multiplexers 120A and 120B output four pieces of two successive data D0-D4, D2-D6, D1-D5 and D3-D7, and the first and second latches 130A and 130B transfer the four data to the second serializer 100B in response to the data transfer signal DOFFB output from the serialization controller 190.

Figure 4:
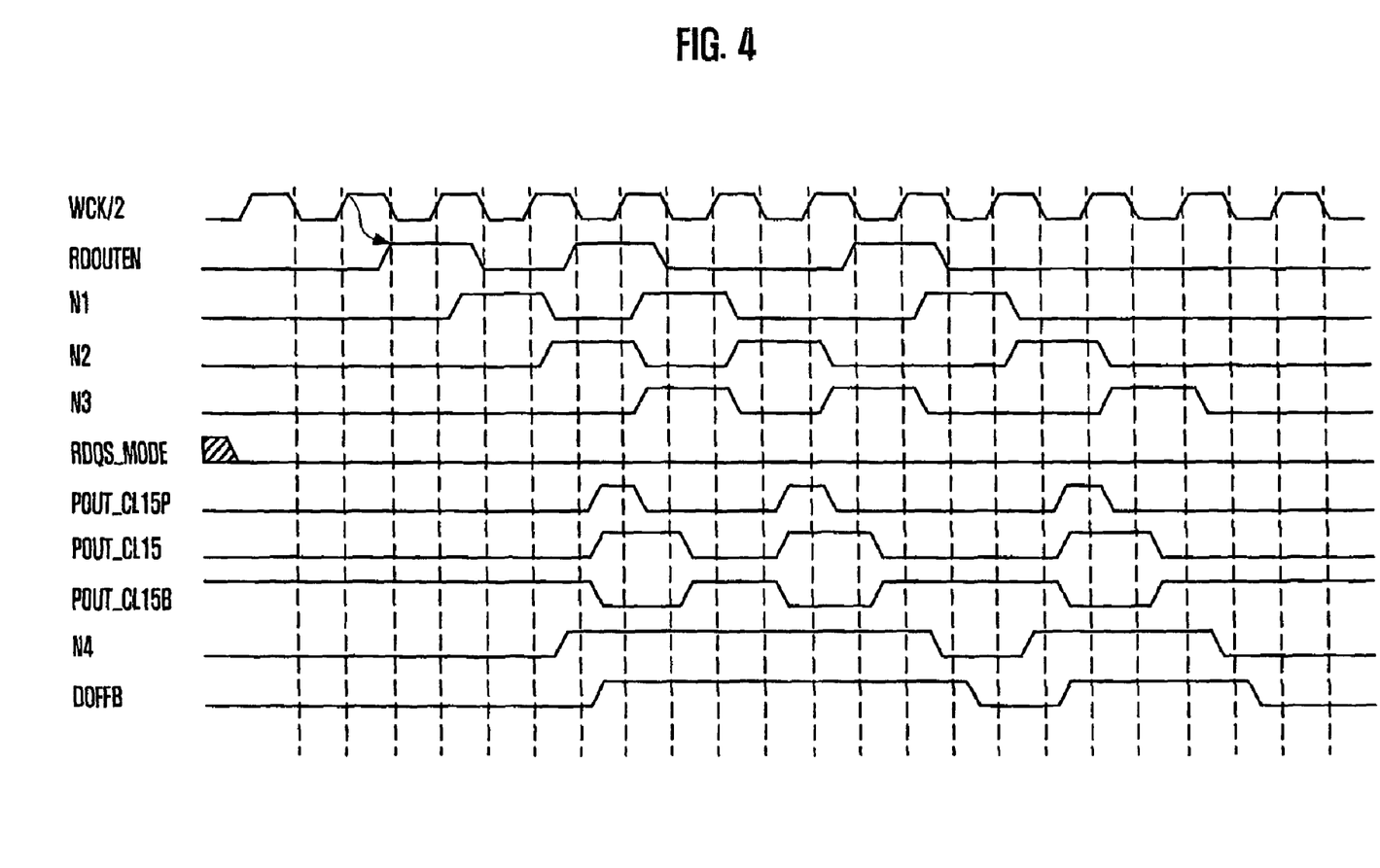
FIG. 4 is a timing diagram illustrating the operation of the serialization controller of FIG. 3 when a strobe mode is disabled.

The two data D2-D6 and D3-D7 of the four data transferred to the second serializer 100B are input to the third and fourth phase shifters 140A and 140B and delayed by 0.5 tCK (2UI). Thereafter, the third and fourth multiplexers 150A and 150B receive the two data, which are delayed by the third and fourth phase shifters 140A and 140B, and the two non-delayed data, which are output from the first and second latches 130A and 130B, and serialize the received data. The serialized two data are transferred to the third serializer 100C through the third and fourth latches 160A and 160B, respectively. In particular, the third and fourth latches 160A and 160B transfer the data prior to 0.25 tCK of the CAS latency (CL) in response to the falling edge of the data clock WCK. Referring to FIG. 4, the operation of the second serializer 100B can be checked through the four data D0-D4, D2-D6, D1-D5 and D3-D7, which are transferred to the input terminals d0, d1, d2 and d3 of the third and fourth multiplexers 150A and 150B, and the two data D0-D2-D4-D6 and D1-D3-D5-D7 at the output terminals d4 and d5 of the third and fourth multiplexers 150A and 150B.

The fifth phase shifter 170 delays the phase of the data D1-D3-D5-D7 transferred to the third serializer 100C through the fourth latch 160B by UI. When the data is transferred to the fifth multiplexer 180 through the third latch 160A at a time point earlier than the read CRC latency (CRCRL) by 0.25 tCK (half cycle of the data clock WCK), that is, in synchronization with the falling edge of the data clock WCK, the fifth multiplexer 180 begins to output the transferred data D0-D2-D4-D6 (RD0) in synchronization with the rising edge of the data clock WCK. On the other hand, the other data D1-D3-D5-D7 (FD0) delayed through the fifth phase shifter 170 is transferred to the fifth multiplexer 180 in synchronization with the rising edge of the data clock WCK, and the fifth multiplexer 180 begins to output the received data in synchronization with the falling edge of the data clock WCK. Through the above-described procedures, the eight CRC data D0-D7 transferred in parallel from a time point when the read CRC latency (CRCRL) elapses after the input of the read command are serialized by the data output circuit and converted into the serialized eight successive CRC data D0-D1-D2-D3-D4-D5-D6-D7.

Figure 3:
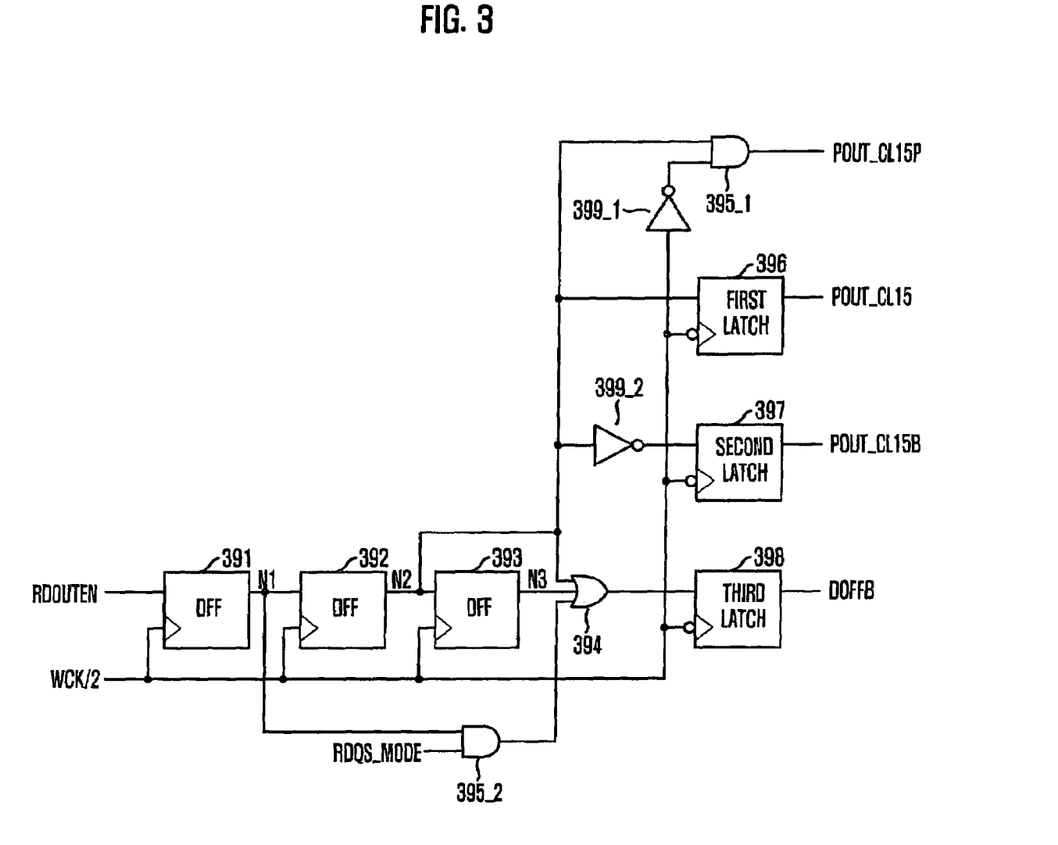
FIG. 3 is a block diagram of a serialization controller of FIG. 1.

FIG. 3 is a block diagram of the serialization controller 190 of FIG. 1.

Referring to FIG. 3, the serialization controller 190 includes a plurality of flip-flops 391, 392 and 393 and first to third latches 396, 397 and 398 for outputting the first control pulse POUT_CL15P, the second control pulses POUT_CL15 and POUT_CL15B, and the data transfer signal DOFFB in response to the read data output enable signal RDOUTEN and the divided clock WCK/2. Specifically, the first latch 396 outputs the first control pulse POUT_CL15P for controlling the first and second phase shifters 110A and 110B in response to the read data output enable signal RDOUTEN, and the second latch 397 outputs the second control pulses POUT_CL15 and POUT_CL15B for controlling the first and second multiplexers 120A and 120B. The second control pulses POUT_CL15 and POUT_CL15B have the activation interval corresponding to two times (1 tCK) the cycle of the data clock WCK. The data transfer signal DOFFB has the activation interval corresponding to four times (2 tCK) the cycle of the data clock and is output through the third latch 398.

More specifically, when the read data output enable signal RDOUTEN is activated to a logic high level at a time point earlier than the read CRC latency (CRCRL) by four cycles of the system clock after the input of the read command, the flip-flops 391, 392 and 393 shift the phase of the read data output enable signal RDOUTEN in synchronization with the divided clock WCK/2. The output terminal N2 of the second flip-flop 392 changes to a logic high level at a time point (CL-2) earlier than the read CRC latency (CRCRL) by two cycles of the system clock. At this point, the first AND gate 395_1 activates the first control pulse POUT_CL15P in synchronization with the divided clock WCK/2 inverted by the first inverter 390_1, that is, the falling edge of the divided clock WCK/2. At this point, the first control pulse POUT_CL15P has the activation interval corresponding to the cycle of the data clock WCK.

After the output terminal N2 of the second flip-flop 392 changes to the logic high level, the first latch 396 generates the second control pulse POUT_CL15 in response to the falling edge of the divided clock WCK/2. On the other hand, the second latch 397 receives the output of the second inverter 399_2 inverting the signal of the output terminal N2 of the second flip-flop 392 generates the inverted signal POUT_CL15B of the second control signal POUT_CL15 in response to the falling edge of the divided clock WCK/2. In this case, the second control pulse POUT_CL15 and the inverted signal POUT_CL15B of the second control pulse POUT_CL15 may have the activation interval of 1 tCK due to the first and second latches 396 and 397 operating in synchronization with the falling edges of the divided clock WCK/2.

With the activation of the second control pulse POUT_CL15, the data transfer signal DOFFB is generated by the third latch 398 operating in synchronization with the falling edges of the divided clock WCK/2. However, since the third latch 398 receives the outputs of the second and third flip-flops 392 and 393 through the OR gate 394, it is possible to output the data transfer signal DOFFB having two times the activation interval of the second control pulse POUT_CL15.

On the other hand, when the strobe mode signal RDQS_MODE is activated and the output of the first flip-flop 391 becomes a logic high level at a time point earlier than the read CRC latency CRCRL by 3 tCK, a second AND gate 395_2 outputs a logic high level signal and the third latch 198 activates the data transfer signal DOFFB faster than the error detection mode by 1 tCK. In addition, when the strobe mode signal RDQS_MODE is activated, the NOR gate 395_3 outputs a logic low level, regardless of the output of the second flip-flop 392. Thus, the first control pulse POUT_CL15 is deactivated to a logic low level and the inverted signal POUT_CL15B of the first control pulse POUT_CL15 is deactivated to a logic high level. Therefore, the parallel transfer of the CRC data is interrupted, and only the logic high level signal and the logic low level signal generated from the first and second phase shifters 110A and 110B are transferred to the first and second latches 130A and 130B through the first and second multiplexers 120A and 120B.

FIG. 4 is a timing diagram illustrating the operation of the serialization controller 190 of FIG. 3 when the strobe mode is disabled. That is, the following description will be made about the phases of the signals output from the serialization controller 190 when the strobe mode signal RDQS_MODE is deactivated.

Referring to FIG. 4, the serialization controller 190 generates a plurality of signals in response to the read data output enable signal RDOUTEN, based on the divided clock WCK/2. First, when the read data output enable signal RDOUTEN is activated, its phase is delayed by the cycle of the divided clock WCK/2 through the plurality of flip-flops 391, 392 and 393 (see the output terminals N1, N2 and N3 of the flip-flops 391, 392 and 393). Then, the first and second latches 396 and 397 of the serialization controller 190 generate the first and second control pulses POUT_CL15P and POUT_CL15/POUT_CL15B in synchronization with the falling edges of the divided clock WCK/2. In addition, the OR gate 394 performs an OR operation on the outputs of the second and third flip-flops 392 and 393 to transfer the output pulse having two times the activation interval to the third latch 398 through the output terminal N4, and the third latch 398 outputs the data transfer signal DOFFB activated for 2 tCK in response to the falling edge of the divided clock WCK/2.

Figure 5:
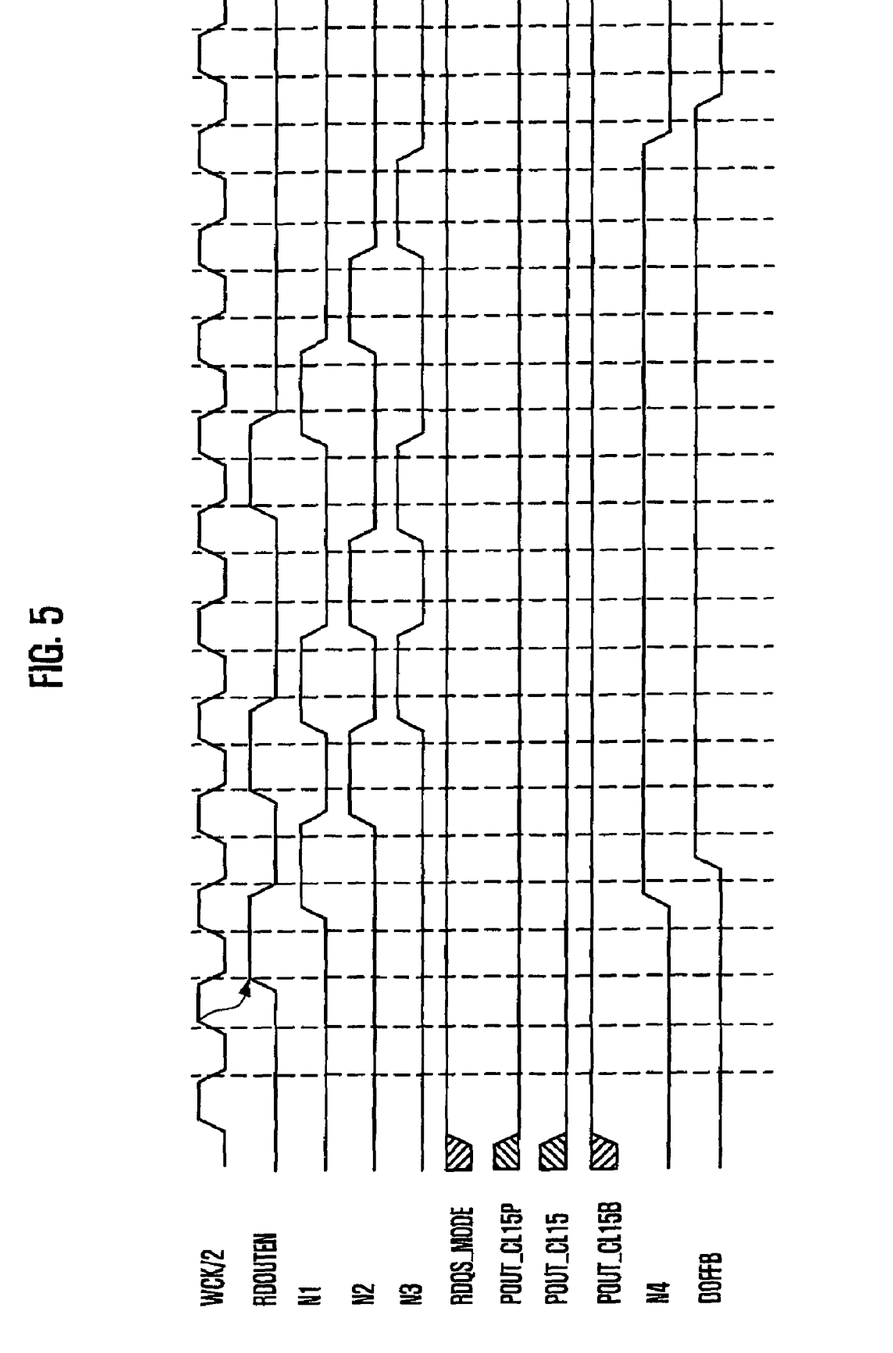
FIG. 5 is a timing diagram illustrating the operation of the serialization controller of FIG. 3 when the strobe mode is enabled.

FIG. 5 is a timing diagram illustrating the operation of the serialization controller 190 of FIG. 3 when the strobe mode is enabled. That is, the following description will be made about the signals output from the serialization controller 190 when the strobe mode signal RDQS_MODE is activated.

Referring to FIG. 5, the outputs of the first to third flip-flops 391 to 393 of the serialization controller are generated in response to the activation of the read data output enable signal RDOUTEN, based on the divided clock WCK/2. However, when the strobe mode signal RDQS_MODE is activated to a logic high level, the first control pulse output from the first latch 396 is deactivated to a logic low level, and the inverted signal POUT_CL15B of the first control pulse POUT_CL15 generated from the second latch 397 is deactivated to a logic high level. On the other hand, the data transfer signal DOFFB output from the third latch 398 is activated for 3 tCK from a time point when the first flip-flop 391 is enabled in response to the activation of the read data output enable signal RDOUTEN. It can be seen from FIG. 5 that the activation intervals of the data transfer signal DOFFB is continuous because the read data output enable signal RDOUTEN is repetitively activated.

Figure 6:
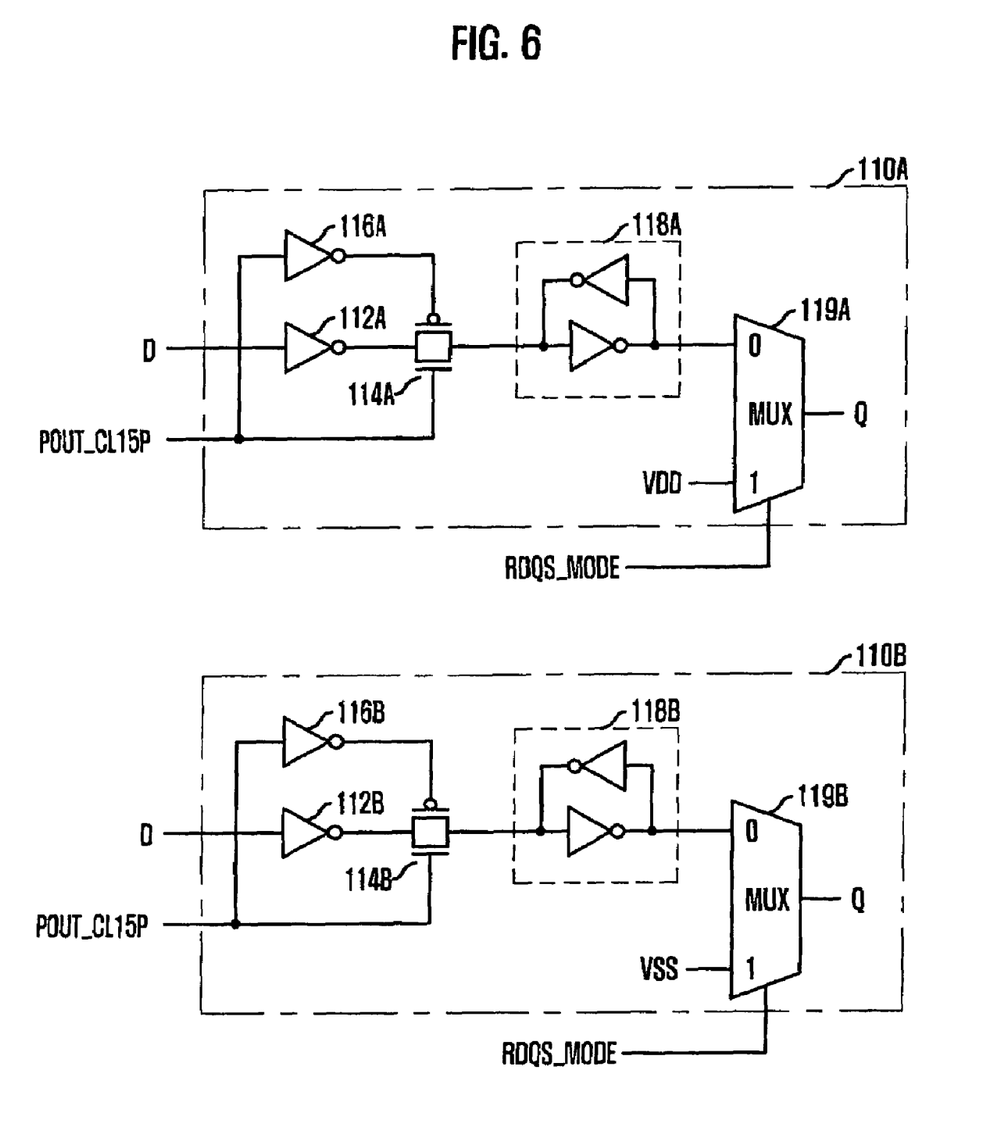
FIG. 6 is a circuit diagram of first and second phase shifters of FIG. 1.

FIG. 6 is a circuit diagram of the first and second phase shifters 110A and 110B of FIG. 1.

Referring to FIG. 6, the first phase shifter 110A includes a plurality of unit shifters 110A_1 for shifting the phases of a plurality of data D4 and D6 input in parallel. The unit shifter 110A_1 includes a fifth inverter 112A for inverting the input data D, a transfer gate 114A for transferring an output of the fifth inverter 112A in response to the first control pulse POUT_CL15P, an inverter latch 118A for latching and inverting an output of the transfer gate 114A, and a multiplexer 119A for transferring an output of the inverter latch 118A in response to the strobe mode signal RDQS_MODE. In addition, the unit shifter 110A_1 further includes a sixth inverter 116A for inverting the first control pulse POUT_CL15P in order to control the transfer gate 114A. The multiplexer 119A outputs the output of the inverter latch 118A, that is, the phase-shifted data, to the first multiplexer 120A when the strobe mode signal RDQS_MODE is deactivated to a logic low level. However, when the strobe mode signal RDQS_MODE is activated to a logic high level, the multiplexer 119A outputs a logic high level (VDD) signal to the first multiplexer 120A.

Referring again to FIG. 6, the second phase shifter 110B has a structure similar to that of the first phase shifter 110A. However, a multiplexer 119B included in a plurality of unit shifters 110B_1 of the second phase shifter 110B receiving a plurality of data D5 and D7 in parallel outputs an output of the inverter latch 118B, that is, the phase-shifted data, to the second multiplexer 120B when the strobe mode signal RDQS_MODE is deactivated to a logic low level, but outputs a logic low level (VSS) signal to the second multiplexer 130A when the strobe mode signal RDQS_MODE is activated to a logic high level.

Figure 7:
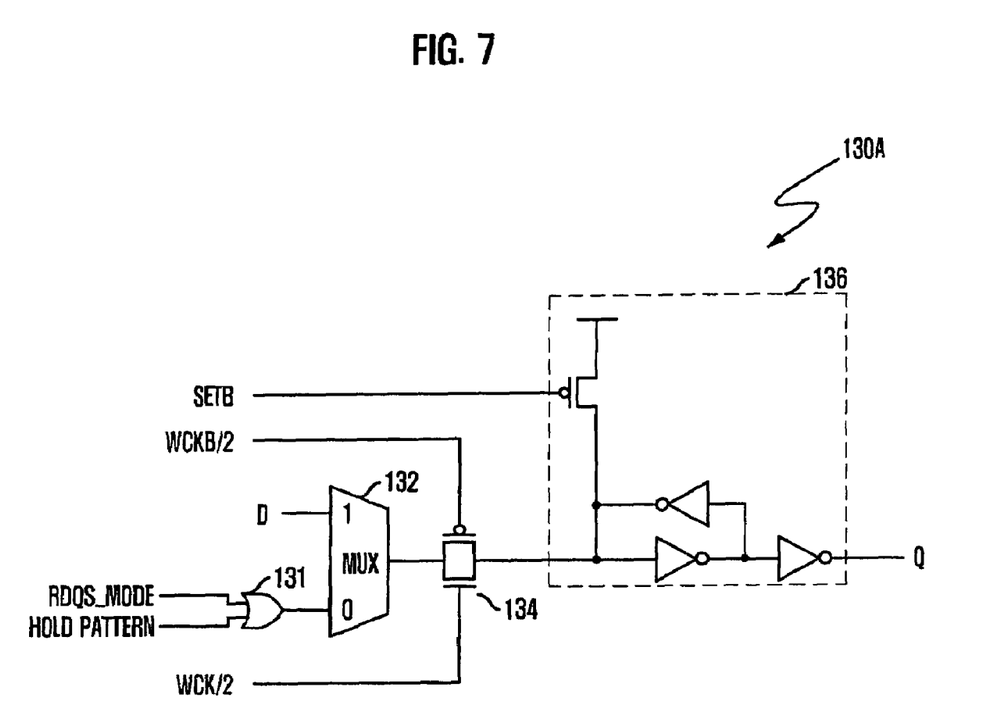
FIG. 7 is a circuit diagram of a first latch of FIG. 1.

FIG. 7 is a circuit diagram of the first latch 130A of FIG. 1.

Referring to FIG. 7, the first latch 130A includes a plurality of unit latches 120A_1 for latching a plurality of two successive data output from the first multiplexer 120A. The unit latch 120A_1 includes a multiplexer 132, a transfer gate 134, and an inverter latch 136. The multiplexer 132 transfers the data input in response to the data transfer signal DOFFB or outputs the strobe mode signal RDQS_MODE and the preset EDC hold pattern HOLD_PATTERN transferred from the mode register. The transfer gate 134 transfers the output of the multiplexer 132 at an interval corresponding to four times the data window of the serialized eight data. The inverter latch 136 latches an output of the transfer gate 134. The strobe mode signal RDQS_MODE and the preset EDC hold pattern HOLD_PATTERN are transferred to the multiplexer 132 through an OR gate 131.

When the data transfer signal DOFFB is at a logic high level, the multiplexer 132 transfers the data D input through the first multiplexer 120A to the transfer gate 134. When the data transfer signal DOFFB is at a logic low level, the multiplexer 132 transfers the logic high level to the transfer gate 134 in the strobe mode, regardless of the level of the input data D, and outputs the preset EDC hold pattern HOLD_PATTERN transferred from the mode register in the error detection mode. In addition, the inverter latch 336 is reset by a setting signal SETB. When the setting signal SETB is activated to a logic low level, the inverter latch 136 outputs a logic high level value, regardless of the output of the transfer gate 334.

Figure 8:
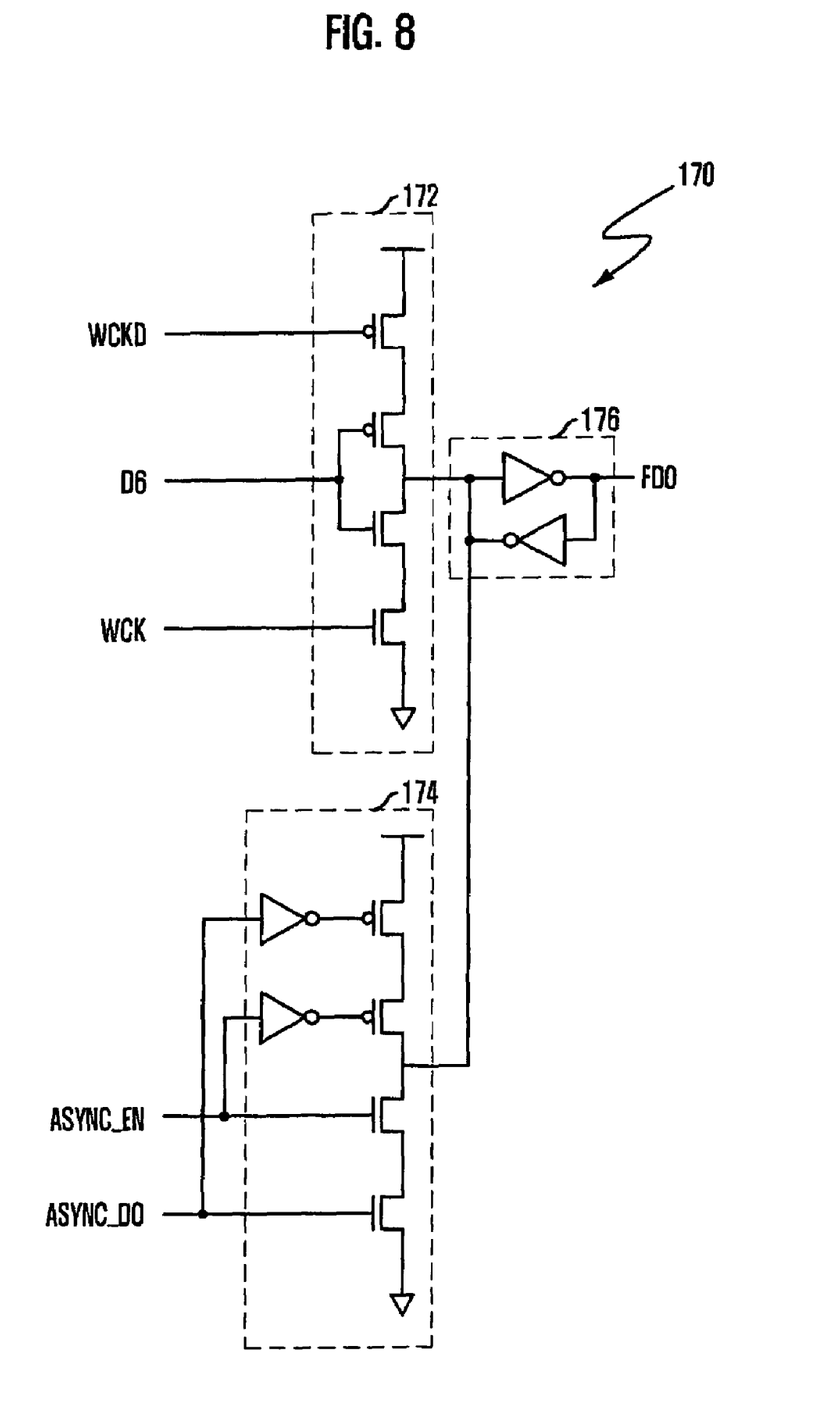
FIG. 8 is a circuit diagram of a fifth phase shifter of FIG. 1.

FIG. 8 is a circuit diagram of the fifth phase shifter 170 of FIG. 1.

Referring to FIG. 8, the fifth phase shifter 170 shifts the phase of the data D6 output from the fourth latch 160B in response to the data clock WCK, or outputs an arbitrary data that are not synchronized with the system clock or the data clock WCK in a test mode or a training mode.

More specifically, the fifth phase shifter 170 includes a data inverting unit 172 for inverting data in synchronization with the data clock WCK, an asynchronous data generating unit 174 for outputting arbitrary data in the test mode or the training mode, and an inverter latch 176 for latching and inverting outputs of the data inverting unit 172 and the asynchronous data generating unit 174. The data inverting unit 172 inverts the input data D6 in synchronization with the rising edge of the data clock WCK, and the inverter latch 176 inverts the output data of the data inverting unit 172 and outputs the inverted data to the fifth multiplexer 180. The fifth multiplexer 180 receives the data output from the fifth phase shifter 170 in synchronization with the rising edge of the data clock WCK and outputs the received data to the outside in synchronization with the falling edge of the data clock WCK.

In the test mode or the training mode where the transferred data are not output, the fifth phase shifter 170 is enabled to output the arbitrary data by activating an asynchronous enable signal ASYNC_EN and an asynchronous start signal ASYNC_D0. At this point, the data clock WCK is deactivated to a logic low level.

A method for operating the semiconductor device in accordance with an embodiment of the present invention includes a first procedure of outputting CRC data for error detection through a CRC data pad, and a second procedure of outputting a data strobe signal output together with data output in response to a read command through the CRC data pad according to an operation mode. The first procedure means that the semiconductor device performs the error detection mode, and the second procedure means that the semiconductor device performs the strobe mode.

More specifically, the first procedure includes: performing a first serialization process to serialize eight parallel CRC data to output four successive data, or output a predetermined pattern HOLD_PATTERN set in a mode register in a standby state; performing a second serialization process to serialize the four successive data to output two successive data; and performing a third serialization process to serialize the two successive data to output the CRC data. The second procedure includes: performing a first serialization process to serialize a predetermined pattern in response to a strobe mode signal RDQS_MODE; performing a second serialization process to serialize an output of the serialized pattern to output two successive data; and performing a third serialization process to serialize the two successive data to output the toggling data strobe signal. The output of the first serialization process has four times the valid window of the CRC data, and the output of the second serialization process has two times the valid window of the CRC data.

The first serialization process includes: shifting a phase of four data of the eight parallel data D0-D7 by four times the data window of the CRC data or outputting the predetermined pattern HOLD_PATTERN in the error detection mode; multiplexing the remaining four data of the eight parallel data and the phase-shifted four data to output the four successive data; and latching the four successive data. However, in the strobe mode, not the error detection mode, the toggling data strobe signal DQS is generated by outputting a self-generated predetermined pattern signal of a logic high level or a logic low level, instead of the CRC data and the preset pattern. The third serialization process outputs arbitrary data, which is not synchronized with a system clock, to the outside in a test mode or a training mode.

As described above, the data output circuit of the semiconductor device in accordance with the embodiment of the present invention outputs the CRC data through the ECD pad so that the data processor can determine if an error occurs in data used in the read and write operations. In addition, if necessary, the semiconductor device can output the data strobe signal DQS, which is output together with the data output in the read operation, thereby increasing the reliability of the data transfer. Through these operations, the data can be output in synchronization with the high-frequency system clock and data clock. In particular, the semiconductor device for graphics, where the high-speed data input/output is considered to be important, can operate in synchronization with the high-frequency system clock, thereby improving the product competitiveness.

Furthermore, although the data output circuit of the semiconductor device has been described exemplarily, the present invention can also be applied to communication and network equipment that serializes a plurality of parallel data. The data output circuit can transfer the CRC data for error detection through specific ports in the network equipment for data transfer and can also output the strobe signal together with the data. Hence, the valid data can be transferred without distortion.

In accordance with the embodiments of the present invention, the semiconductor device can output the CRC data through the EDC pad, thereby increasing the reliability of the data transfer in the high-speed data input/output operation.

Furthermore, the semiconductor device can output the data strobe signal, which is output together with the data in the read operation, through the EDC pad according to the operation mode, thereby improving the reliability of the transferred data. Moreover, since a variety of signals including the CRC data and the data strobe signal can be output through one pad according to the operation mode, the number of the pads and the entire circuit area can be reduced.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
   a pad for outputting a cyclic redundancy check CRC data for error detection; and
   a signal outputting unit for natively outputting the CRC data and a data strobe signal, which is output together with data being output in response to a read command, through the pad according to different operation modes of the semiconductor device,
   wherein the semiconductor device outputs a pattern data set in a mode register through the pad in a standby state of an error detection mode.

2. The semiconductor device as recited in claim 1, wherein the semiconductor device outputs a CRC data for a write operation through the pad in a write error detection mode, outputs a CRC data for a read operation through the pad in a read error detection mode.

3. The semiconductor device as recited in claim 2, wherein the CRC data for the write operation, the CRC data for the read operation, and the pattern data set in the mode register are transferred in parallel through global data lines to a data output circuit connected to the pad.

4. The semiconductor device as recited in claim 3, wherein the data output circuit comprises:
   a first serializer configured to serialize eight data transferred in parallel in the error detection mode to output four successive data or the pattern data, and generate the data strobe signal in a strobe output mode, instead of the four data;
   a second serializer configured to receive an output of the first serializer to output two successive data; and
   a third serializer configured to receive an output of the second serializer to output a serialized data.

5. The semiconductor device as recited in claim 4, wherein the output of the first serializer has four times the valid window of a window of the serialized data.

6. The semiconductor device as recited in claim 5, wherein the first serializer comprises:
   a phase shifter configured to shift a phase of four data of the eight data transferred in parallel in the error detection mode, and output the pattern data in the strobe output mode, instead of the four data;

a multiplexer configured to multiplex the remaining four data of the eight data and an output of the phase shifter to output four successive data; and a latch configured to latch an output of the multiplexer or output the pattern data in the standby state during the error detection mode.

7. The semiconductor device as recited in claim 6, further comprising a serialization controller configured to control the phase shifter, the multiplexer, and the latch according to the read command or the strobe output mode.

8. The semiconductor device as recited in claim 4, wherein the output of the second serializer has two times the valid window of each window of the serialized data.

9. The semiconductor device as recited in claim 1, wherein the semiconductor device outputs the data strobe signal, which is output together with the data being output in response to the read command, through the pad in a strobe output mode of the operation modes, and outputs a logic high level in a standby state during the strobe output mode.

10. A semiconductor device, comprising:
a plurality of pads through which input/output data and signals are transferred;
a first unit configured to output a CRC data for an error detection operation through single pad of the plurality of pads based on an operation mode of the semiconductor device; and
a second unit configured to output a data strobe signal, which is output together with data output in response to a read command, through the single pad based on operation mode of the semiconductor device,
wherein the first unit outputs an error detection pattern data preset in a mode register instead of the CRC data through the single pad in a standby state of an error detection mode.

11. The semiconductor device as recited in claim 10, wherein the first unit serializes the CRC data transferred in parallel through a plurality of global data lines, and outputs the serialized data through the single pad.

12. The semiconductor device as recited in claim 10, wherein the second unit comprises a phase shifter configured to generate the data strobe signal toggling according to a column address strobe latency in a strobe mode, instead of the CRC data, the data strobe signal being output through the single pad.

13. A semiconductor device, comprising:
a first serializer configured to receive eight parallel CRC data to output four successive data having four times the data window of a serialized eight data, or output a first pattern for a strobe signal according to an operation mode of the semiconductor device or a second pattern to be output in a standby state;
a second serializer configured to receive an output of the first serializer to output two pieces of four successive data having two times the data window of the serialized eight data; and
a third serializer configured to receive an output of the second serializer to output a serialized data through a single pad of the semiconductor device;
wherein the first serializer outputs the second pattern preset in a mode register through the single pad in the standby state of an error detection mode.

14. The semiconductor device as recited in claim 13, wherein the first serializer comprises:
a phase shifter configured to output a preamble data according to the operation mode, shift a phase of four data of the eight data by four times the data window of the serialized data, or output a portion of the first pattern;
a multiplexer configured to multiplex the remaining four data of the eight data and an output of the phase shifter to output the four successive data; and
a latch configured to latch and transfer an output of the multiplexer or output the second pattern transferred from the mode register.

15. The semiconductor device as recited in claim 14, further comprising a serialization controller configured to control the first serializer in response to a data enable signal for enabling the data transfer and a signal for determining the operation mode, based on a data clock serving as a reference of the data output.

16. The semiconductor device as recited in claim 15, wherein the serialization controller comprises:
a first latch configured to generate a first control pulse for controlling the phase shifter in response to a read data output enable signal; and
a second latch configured to generate a second control pulse having two times the activation interval of the data clock or having the activation interval defined by the operation mode in order to control the latch.

17. The semiconductor device as recited in claim 13, wherein the third serializer outputs arbitrary data, which is not synchronized with a system clock, to the outside in a test mode or a training mode.

* * * * *